(12) United States Patent
Regev et al.

(10) Patent No.: US 7,139,866 B2
(45) Date of Patent: Nov. 21, 2006

(54) CAM WITH AUTOMATIC WRITING TO THE NEXT FREE ADDRESS

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 267 days.

(21) Appl. No.: 10/330,218

(22) Filed: Dec. 30, 2002

(65) Prior Publication Data

US 2004/0128438 A1 Jul. 1, 2004

(51) Int. Cl.
*G06F 12/00* (2006.01)
(52) U.S. Cl. .......................... 711/108; 365/49
(58) Field of Classification Search ................ 711/108, 711/128
See application file for complete search history.

(56) References Cited

U.S. PATENT DOCUMENTS

| | | | |
|---|---|---|---|
| 5,555,397 A * | 9/1996 | Sasama et al. | 711/158 |
| 6,108,747 A * | 8/2000 | Kaganoi | 711/108 |
| 6,240,485 B1 * | 5/2001 | Srinivasan et al. | 711/108 |
| 6,647,457 B1 * | 11/2003 | Sywyk et al. | 711/108 |
| 6,697,275 B1 * | 2/2004 | Sywyk et al. | 365/49 |
| 6,697,276 B1 * | 2/2004 | Pereira et al. | 365/49 |
| 6,700,809 B1 * | 3/2004 | Ng et al. | 365/49 |
| 6,711,041 B1 * | 3/2004 | Pereira et al. | 365/49 |
| 6,809,944 B1 * | 10/2004 | Regev et al. | 365/49 |

* cited by examiner

Primary Examiner—Nasser Moazzami
(74) Attorney, Agent, or Firm—Dickstein Shapiro LLP

(57) ABSTRACT

A method and apparatus for automatically writing non-matching data to a non-valid location within a Content Addressable Memory (CAM) is disclosed. The non-valid locations are determined simultaneously with a search process for a matching address, so that in the event of a non-match, the new data can be written to the invalid locations in a single clock cycle.

31 Claims, 6 Drawing Sheets

CAM WITH AUTOMATIC WRITING TO THE NEXT FREE ADDRESS

FIELD OF THE INVENTION

The invention relates to Content Addressable Memories (CAMs) and more specifically to a method and apparatus for automatically writing non-matching data to a location not already holding valid data.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data input to the device or in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory search on a RAM, the user supplies the address and gets back the data stored in that address (location).

In a CAM, however, data is stored in locations in a somewhat random fashion. The locations can be selected by an address, or the data can be written into a first empty memory location (also known as the NFA or Next Free Address). Once information is stored in a memory location, it is found doing a memory search by comparing every bit in any memory location with every bit of data in a comparand register circuit. When the content stored in the CAM memory location does not match the data placed in the comparand register, the local match detect circuit associated with the CAM memory location returns a no-match indication. When the content stored in the CAM memory location matches the data placed in the comparand register, the local match detect circuit associated with the CAM memory location returns a match indication. If a match is found then the CAM returns the identification of the memory address location in which the matching data is stored or address locations of a highest priority memory location if more than one memory location contained matching data. Thus, with a CAM, the user supplies the data and gets back an indication of an address where a matching data is stored in the memory.

In typical applications where CAMs are utilized, it is desirable to write in new data not found in a database (a so-called learning operation), wherein when the data searched for is not found as matching data in the database, the search for data is stored in an empty location in the CAM. In prior art, the learning operation in a CAM is comprised of a sequence of operations including a) a search for the data in the database; b) a new search operation specifically to find the next free address NFA, and c) a write process wherein the new "learned" data is stored at the NFA location. Consequently, a CAM array which avoids these cumbersome and time-consuming operations is desired.

BRIEF SUMMARY OF THE INVENTION

The present invention expedites the writing of data to a CAM array in those cases where that data does not match with any of the existing data contained within the CAM array. With the invention, a write operation could be accomplished in a single clock cycle.

In one aspect, the invention provides a plurality of memory storage locations, each having an associated indicator for indicating that the memory storage location is available for data storage and an associated match line for indicating if a search word matches a word stored in the memory storage location. The invention also provides a priority encoder circuit having a plurality of inputs coupled to received signals from the indicators and match lines, with the priority encoder being operable in a first mode to indicate the address of a highest priority match on the match lines and in a second mode to indicate a highest priority storage location available for data storage. The invention can determine an NFA prior to writing new data into the CAM.

BRIEF DESCRIPTION OF THE DRAWINGS

The above and other features of the invention will be more clearly understood from the following detailed description of the invention provided in connection with the accompanying drawings.

DETAILED DESCRIPTION OF THE INVENTION

Figure 1:
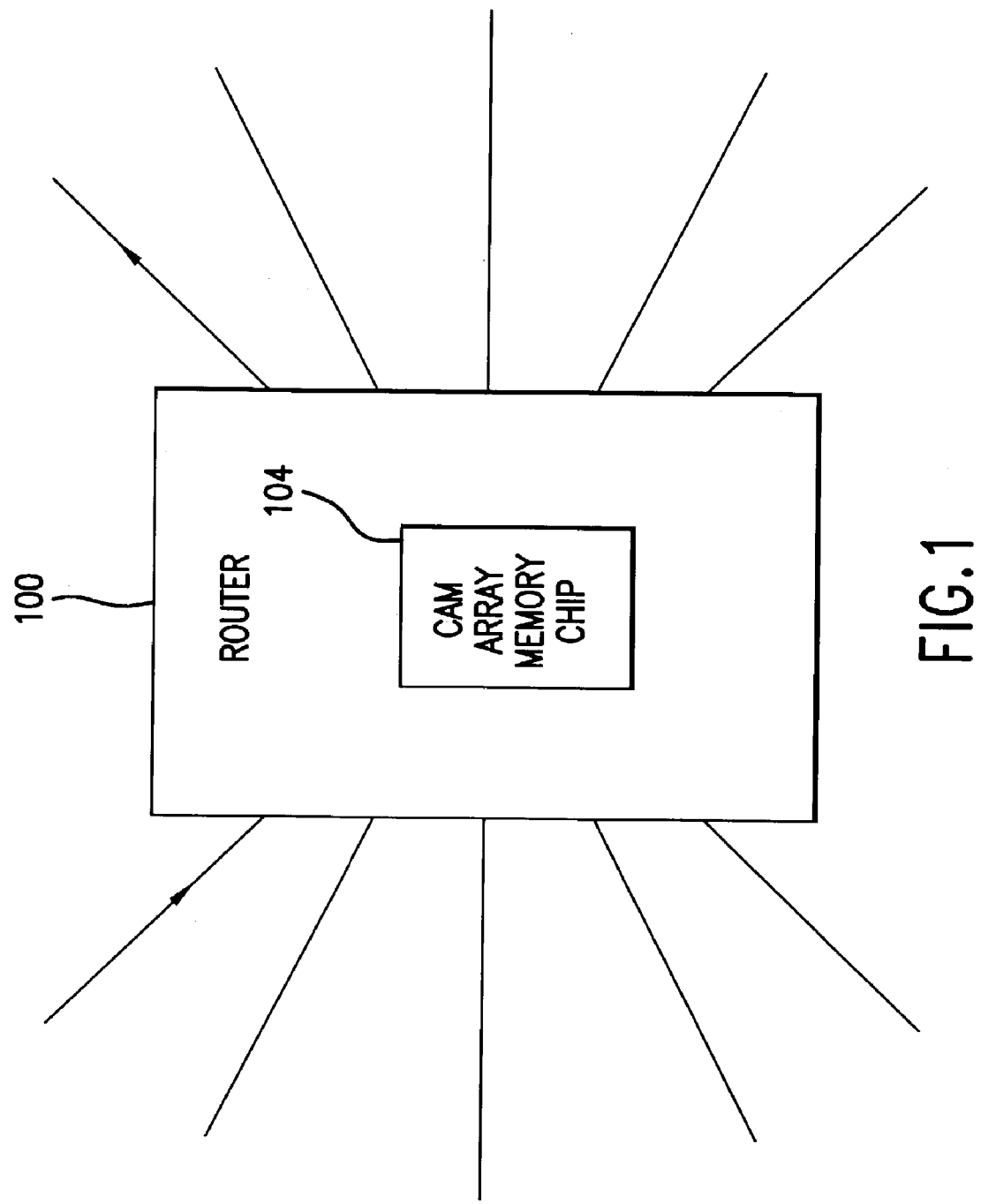
FIG. 1 depicts a simplified block diagram of a router employing a CAM array equipped with a multi-match circuit of the present invention.

FIG. 1 is a simplified block diagram of a router 100 connected to a CAM array memory chip 104 as may be used in a communications network, such as, e.g., part of the Internet backbone. The router 100 contains a plurality of input lines and a plurality of output lines. When data is transmitted from one location to another, it is sent in a form known as a packet. Oftentimes, prior to the packet reaching its final destination, that packet is first received by a router, or some other device. The router 100 then decodes that part of the data identifying the ultimate destination and decides which output line and what forwarding instructions are required for the packet.

Generally, CAMs are very useful in router applications because of their ability for instantaneous search of a large database. As a result, when a packet is received by the router 100, the router already has a table of forwarding instructions for each ultimate destination stored within its CAM. Therefore, only that portion of the packet that identifies the sender and recipient need be decoded in order to perform a search of the CAM to identify which output line and instructions are required to pass the packet onto a next node of its journey.

In many applications where CAMs are used, the data stored in the CAM is acquired by a process of learning or absorption, wherein a specific data value is searched in the CAM, and if not found, the data is stored (or learned) in the CAM for later use. To store data in the CAM, the user must know which location (address) in the CAM is free, i.e. the NFA, and thus may be written to. Writing data into the CAM typically requires a search for a free address, and a write operation performed to that free address. In the present invention the CAM automatically generates the NFA to which the new data is to be written and therefore if a search does not yield a match within the CAM, the NFA is always present, and the data in the comparand register can be written automatically to that NFA.

Figure 2:
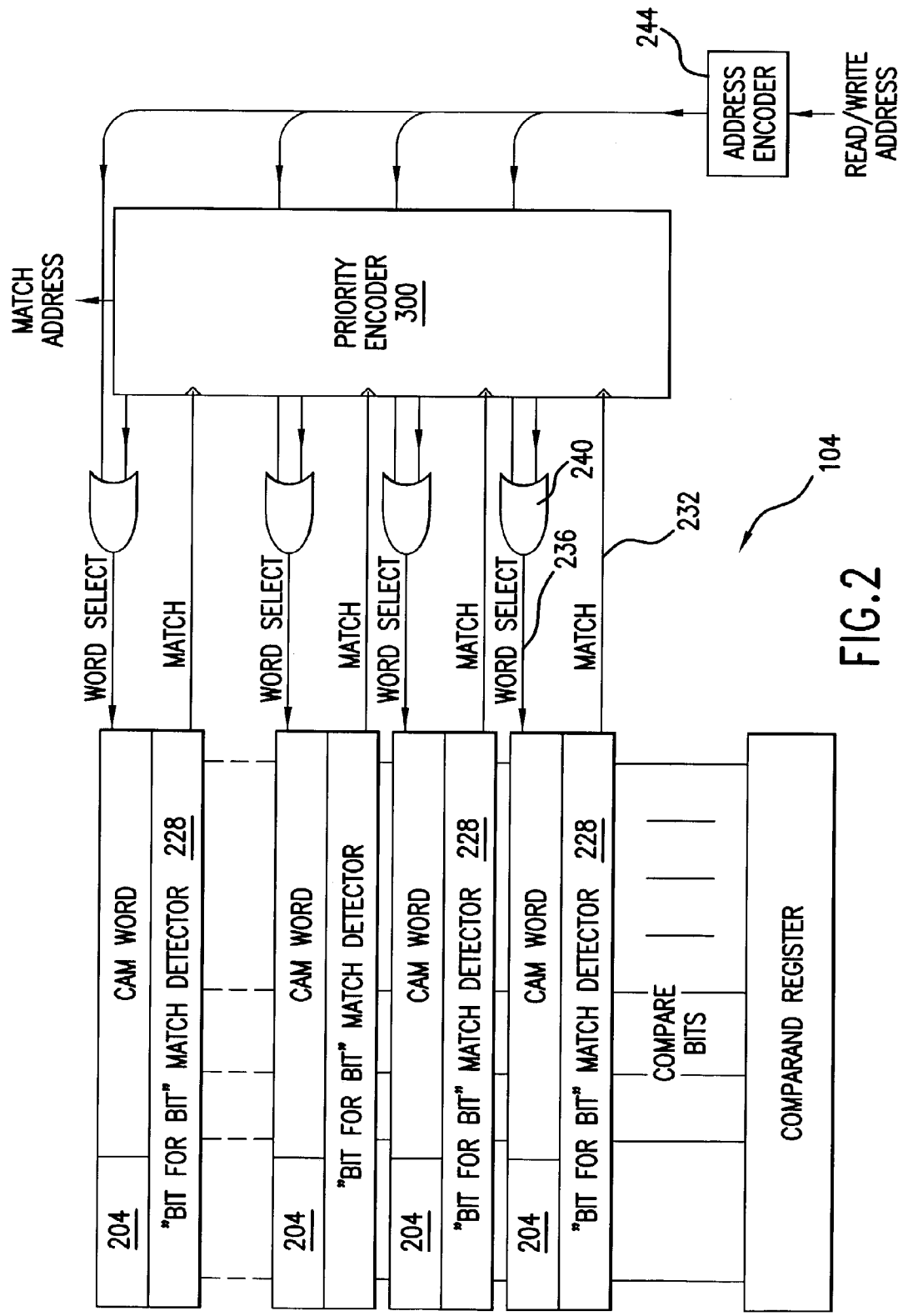
FIG. 2 shows a first embodiment of the invention.

A first embodiment of the CAM array 104 of the present invention is shown in FIG. 2. A plurality of CAM words each have a respective match detector 228 having an output connected to a respective input of a priority encoder 300. An address decoder 244 is connected to a respective OR gate 240 for indicating a specific word in the CAM array 104 to be written to.

Within the CAM array 104, a "learn" operation requires two operational stages. In the first stage of the search operation, the VALID bit 204 of every location (word) in the CAM is checked. Typically, a VALID bit is "1" in a CAM location holding stored valid data, and the VALID bit is "0" when a location is empty or invalid. All the VALID bits 204 are connected to the priority encoder 300. The inputs to the priority encoder 300 are active when "0", and therefore all invalid locations are considered active. The priority encoder 300 only responds to one active highest priority input, and ignores all other active inputs. The priority encoder 300 then indicates an address of an empty location in the CAM, and this indication is temporarily stored within the priority encoder 300. The address decoder 244 in combination with the OR gate 240 then activates the specific word select line 236 indicated by the priority encoder 300.

In the second stage of operation, a write is done into the NFA found in the first stage of the operation. The word to write into is selected by its word select 236 which gets its input from the priority encoder. OR gate 240 allows CAM words to be selected either by the priority encoder 300 (in the case of a learn operation) or from the decoded address (in the case of an addressed read or write).

Figure 3:
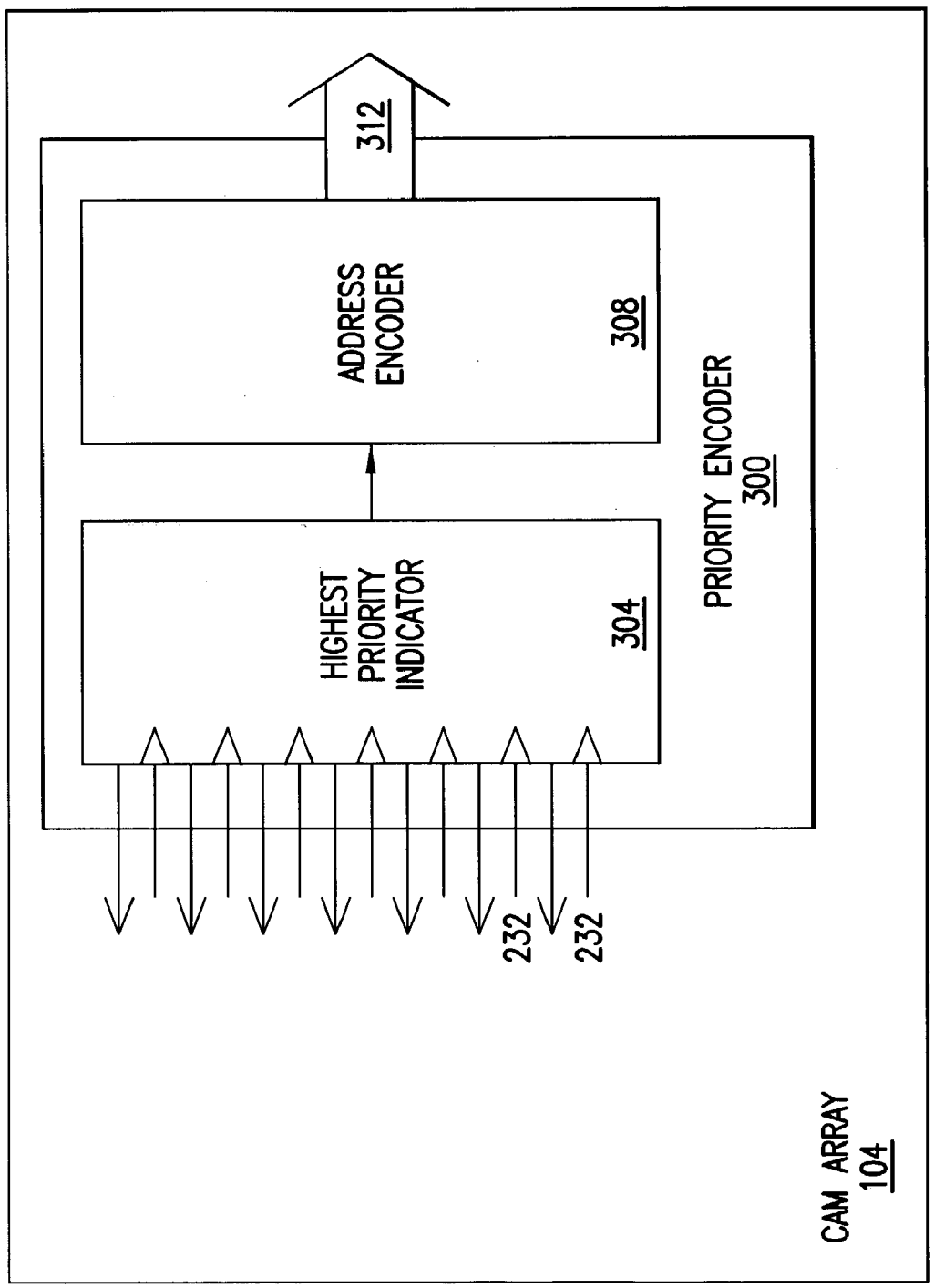
FIG. 3 is a block diagram of the priority encoder.

The priority encoder 300 of the present invention is comprised of two sections, as shown in FIG. 3. The highest priority indicator 304 is followed by the address encoder 308. Every memory location in the CAM array 104 has exactly one input into the highest priority indicator 304. Although many matches can occur during a CAM search, one purpose of the highest priority indicator 304 is to select a single memory location and provide that location to an address encoder 308. Thus, the highest priority indicator 304 will always indicate one and only one location within the CAM array 104 to the address encoder 308. The address encoder 308 then outputs an address as shown by the arrow 312.

Figure 4:
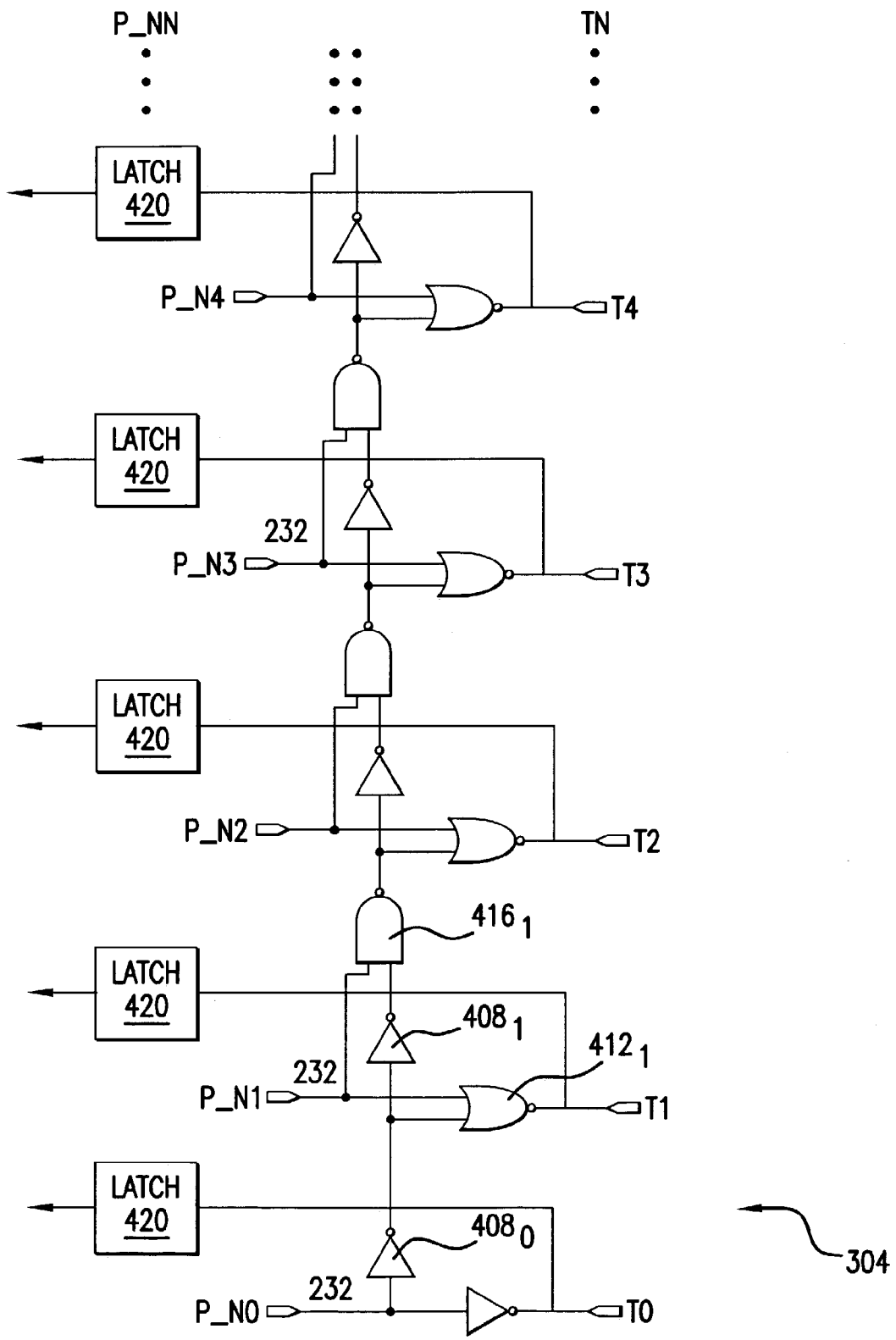
FIG. 4 is a schematic diagram of the highest priority indicator.

FIG. 4 shows an exemplary embodiment of the highest priority indicator (HPI) 304. The HPI operates as follows. In an initial state, all inputs P_N0 through P_NN are at a state of "1" which is the inactive state, while all the outputs T0 through TN are in the inactive state of "0". Whenever any input P_N* goes to the active state of "0", the output associated with this input T* becomes active as well, and goes to the state of "1". An active input disables all the inputs above it in the chain, forcing their associated outputs to remain inactive ("0"). An active input on an input P_N0 will cause the output T1 of P_N1 to be inactive because of the inverter $408_0$ which feeds into the NOR gate $412_1$. Similarly, each succeeding output will be disabled partially by the NAND gates $416_{1-N}$.

Thus, the bottom of the highest priority indicator 304 has the highest priority, and the priority descends toward the top. Accordingly, input P_N0 will always have the highest priority over any other input. Therefore, if any number of inputs is simultaneously active, the highest priority indicator will activate only the output associated with the highest priority active input, leaving all other outputs inactive. Thus, the highest priority indicator 304 can be relied upon to consistently present one and only one location within the CAM 104 to the address encoder 308.

The location of a CAM word available for writing is indicated by enabling one of the latches 420. An enabled latch 420 activates one of the word select lines 236, thereby pointing to the highest priority CAM word for writing new data. Because the address encoder 308 and address decoded 244 are not utilized in the pointing process, the entire write process can be accomplished in a single clock cycle.

Figure 5:
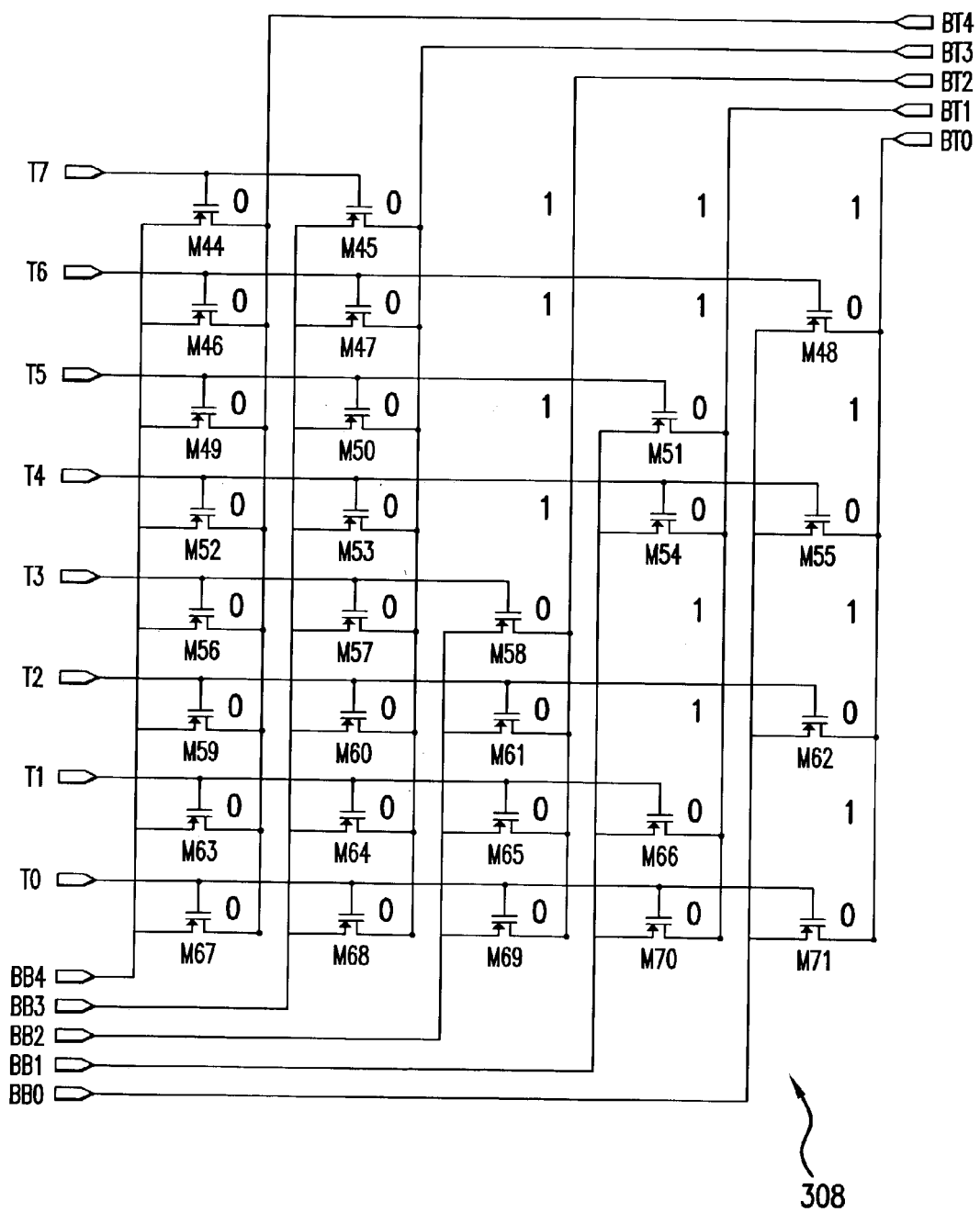
FIG. 5 is a schematic diagram of the address encoder.

Many methods could used to convert the output of the highest priority indicator 304 into an address. The simplest method is that of a look-up table, although the present invention should not be limited only to that conversion method. FIG. 5 shows an 8 bit section of a 32 bit look-up table which comprises the address encoder 308 of the present invention. The inputs BB0 through BB4 are connected to ground, and the pins marked as BT0 through BT4 are each connected to the power supply via a separate resistor.

The operation of the address encoder 308 will now be explained using a simple example. T0–T7 will be enabled at any given time. Now assume that the input T0 is "1", turning ON all the transistors M67 through M71 connected thereto. The resulting current through the turned ON transistors causes the voltage at the output pins BT0 through BT4 to go down to zero volts, thus forming the binary output value of 00000. Now suppose instead the input T3 is active, transistors M56–58 would be enabled so that only the outputs BT2, BT3, and BT4 go to 0 volts, while BT0 and BT1 are pulled high. Thus the binary value 00011 would be present on the output pins BT0 through BT4.

The priority encoder 300 of the present invention could also be implemented in a hierarchical fashion out of many smaller priority encoders. For example, a 256 input priority encoder could be constructed out of 17 sixteen-input priority encoders. Each of sixteen inputs would go to one of sixteen priority encoders and the 17th input determines a priority among the first sixteen priority encoders. Each of the sixteen priority encoders could be further constructed using five four input priority encoders. The fifth priority encoder used to select from among the first four priority encoders.

Figure 6:
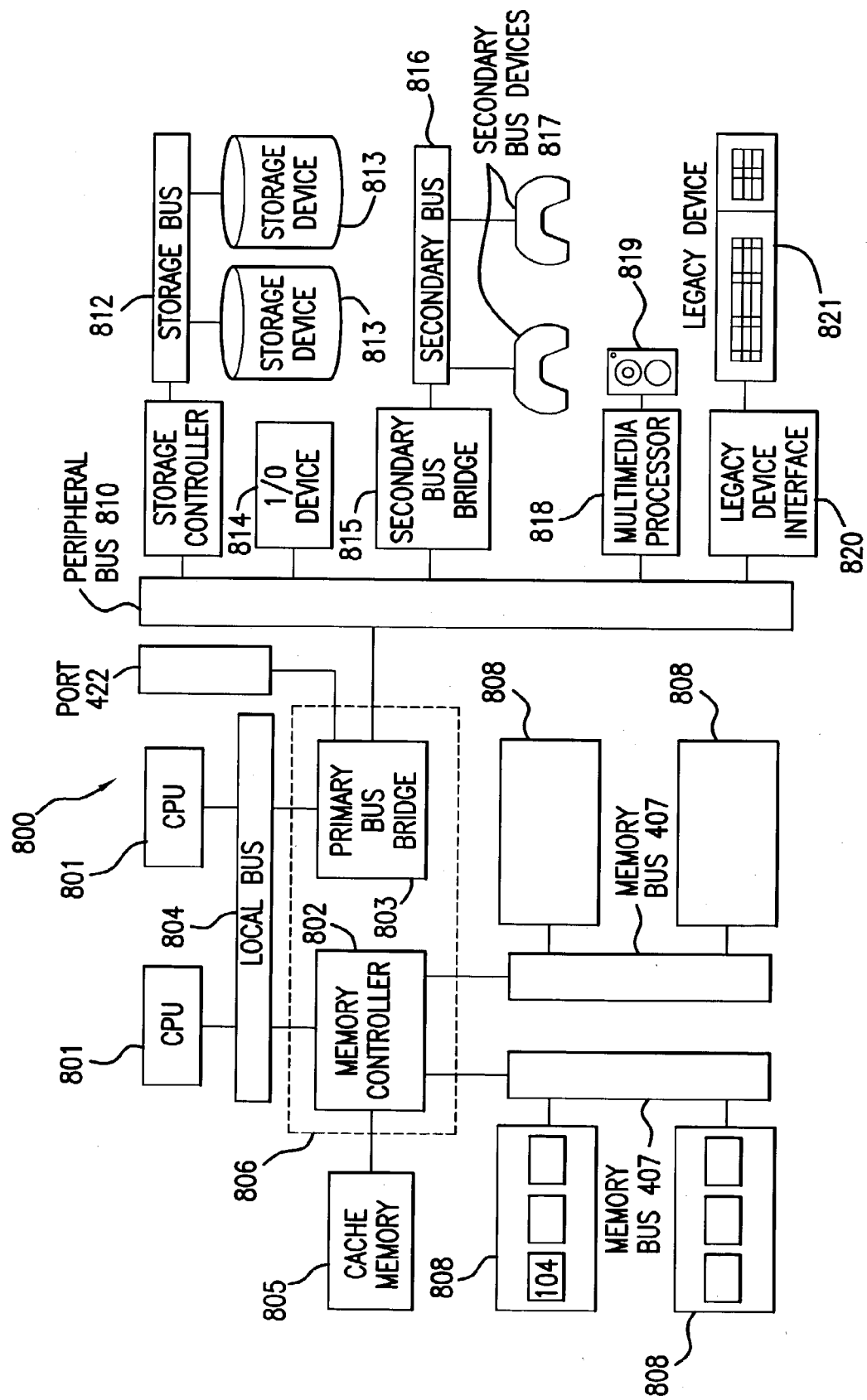
FIG. 6 shows use of a CAM in accordance with the present invention used within a processor system.

FIG. 6 illustrates an exemplary processing system 600 which utilizes the CAM arrays of the present invention. The processing system 600 includes one or more processors 601 coupled to a local bus 604. A memory controller 602 and a primary bus bridge 603 are also coupled the local bus 604. The processing system 600 may include multiple memory controllers 602 and/or multiple primary bus bridges 603. The memory controller 602 and the primary bus bridge 603 may be integrated as a single device 606.

The memory controller 602 is also coupled to one or more memory buses 607. Each memory bus accepts memory components 608. Any one of memory components 608 may contain a CAM array of the present invention.

The memory components 608 may be a memory card or a memory module. The memory components 608 may include one or more additional devices 609. For example, in a SIMM or DIMM, the additional device 609 might be a configuration memory, such as a serial presence detect (SPD) memory. The memory controller 602 may also be coupled to a cache memory 605. The cache memory 605 may be the only cache memory in the processing system. Alternatively, other devices, for example, processors 601 may also include cache memories, which may form a cache hierarchy with cache memory 605. If the processing system 600 include peripherals or controllers which are bus masters or which support direct memory access (DMA), the memory controller 602 may implement a cache coherency protocol. If the memory controller 602 is coupled to a plurality of memory buses 607, each memory bus 607 may be operated in parallel, or different address ranges may be mapped to different memory buses 607.

The primary bus bridge 603 is coupled to at least one peripheral bus 610. Various devices, such as peripherals or additional bus bridges may be coupled to the peripheral bus 610. These devices may include a storage controller 611, an miscellaneous I/O device 614, a secondary bus bridge 615, a multimedia processor 618, and an legacy device interface 620. The primary bus bridge 603 may also coupled to one or more special purpose high speed ports 622. In a personal computer, for example, the special purpose port might be the Accelerated Graphics Port (AGP), used to couple a high performance video card to the processing system 600.

The storage controller 611 couples one or more storage devices 613, via a storage bus 612, to the peripheral bus 610. For example, the storage controller 611 may be a SCSI controller and storage devices 613 may be SCSI discs. The I/O device 614 may be any sort of peripheral. For example, the I/O device 614 may be an local area network interface, such as an Ethernet card. The secondary bus bridge may be used to interface additional devices via another bus to the processing system. For example, the secondary bus bridge may be an universal serial port (USB) controller used to couple USB devices 617 via to the processing system 600. The multimedia processor 618 may be a sound card, a video capture card, or any other type of media interface, which may also be coupled to one additional devices such as speakers 619. The legacy device interface 620 is used to couple legacy devices, for example, older styled keyboards and mice, to the processing system 600.

The processing system 600 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 600 to become more suitable for use in a variety of applications. For example, many electronic devices which require processing may be implemented using a simpler architecture which relies on a CPU 601 coupled to memory components 608 and/or memory devices 609. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A content addressable memory, comprising:
   a plurality of memory storage locations, each having an associated indicator for indicating, during a search operation of all words in said plurality of memory storage locations, that the memory storage location is available for data storage and an associated match line for indicating, during said search operation, if a search word matches a word stored in an associated memory storage location, and a circuit operating such that if said search word does not match a word stored in any of said plurality of memory storage locations, said search word is written to a highest priority memory storage location which is indicated as available for data storage; and
   a priority encoder circuit having a plurality of inputs coupled to receive signals from said indicators and match lines, said priority encoder being operable in a first mode to indicate the address of a highest priority match on said match lines and in a second mode to indicate the highest priority memory storage location available for data storage.

2. The content addressable memory of claim 1, further comprising:
   a plurality of latches located within said priority encoder circuit, for pointing to said highest priority storage location.

3. The content addressable memory of claim 1, wherein said priority encoder circuit provides respective word select signals for a memory access operation of a respective memory storage location.

4. The content addressable memory of claim 3, wherein said memory access operation includes a read operation.

5. The content addressable memory of claim 3, wherein said memory access operation includes a write memory operation.

6. The content addressable memory of claim 1, wherein said indicator is a stored bit.

7. The content addressable memory of claim 1, wherein said priority encoder circuit further comprises an address encoder for indicating an address associated with a highest priority output of said highest priority indicator circuit.

8. The CAM array of claim 7, wherein said address encoder further comprises a lookup table.

9. A method of operating a content addressable memory array, comprising:
   searching memory locations of a memory array for a match with the contents of a comparand; each of said memory locations having an associated indicator for indicating if the memory location is available for data storage;
   searching each of said indicators for memory locations available for data storage, wherein said step of searching each of said indicators occurs during said step of searching memory locations;
   determining a priority of any matches found;
   enabling a latch associated with an available memory storage location as a result of said indicator searching;
   generating a next free address corresponding to an identified memory location which is indicated as available for data storage; and
   storing the contents of said comparand in said identified memory location, if no match is found during said match searching,
   wherein said enabling, generating and storing steps are performed within a single clock cycle.

10. A router, comprising:
a plurality of message receiving inputs;
a plurality of message transmitting outputs; and
a content addressable memory, said content addressable memory being used to route messages on said inputs to said outputs, said content addressable memory comprising:
a plurality of memory storage locations, each having an associated indicator for indicating, during a search operation of all words in said plurality of memory storage locations, that the memory storage location is available for data storage and an associated match line for indicating, during said search operation, if a search word matches a word stored in an associated memory storage location, and a circuit operating such that if said search word does not match a word stored in any memory storage location, said search word is written to a highest priority memory storage location which is indicated as available for data storage; and
a priority encoder circuit having a plurality of inputs coupled to receive signals from said indicators and match lines, said priority encoder being operable in a first mode to indicate the address of a highest priority match on said match lines and in a second mode to indicate the highest priority memory storage location available for data storage.

11. The router of claim 10, further comprising:
a plurality of latches located within said priority encoder circuit, for pointing to said highest priority storage location.

12. The router of claim 10, wherein said priority encoder circuit provides respective word select signals for a memory access operation of a respective memory storage location.

13. The router of claim 12, wherein said memory access operation includes a read operation.

14. The router of claim 12, wherein said memory access operation includes a write memory operation.

15. The router of claim 10, wherein said indicator is a stored bit.

16. The router of claim 10, wherein said priority encoder circuit further comprises an address encoder for indicating an address associated with a highest priority output of said highest priority indicator circuit.

17. The router of claim 16, wherein said address encoder further comprises a lookup table.

18. A processor circuit, comprising
a processor; and
a content-addressable memory circuit for exchanging data with said processor, said content addressable memory circuit comprising:
a plurality of memory storage locations, each having an associated indicator for indicating, during a search operation of all words in said plurality of memory storage locations, that the memory storage location is available for data storage and an associated match line for indicating, during said search operation, if a search word matches a word stored in an associated memory storage location, and a circuit operating such that if said search word does not match a word stored in any memory storage location, said search word is written to a highest priority memory storage location which is indicated as available for data storage; and
a priority encoder circuit having a plurality of inputs coupled to receive signals from said indicators and match lines, said priority encoder being operable in a first mode to indicate the address of a highest priority match on said match lines and in a second mode to indicate the highest priority memory storage location available for data storage.

19. The processor circuit of claim 18, further comprising:
a plurality of latches located within said priority encoder circuit, for pointing to said highest priority storage location.

20. The processor circuit of claim 18, wherein said priority encoder circuit provides respective word select signals for a memory access operation of a respective memory storage location.

21. The processor circuit of claim 20, wherein said memory access operation includes a read operation.

22. The processor circuit of claim 20, wherein said memory access operation includes a write memory operation.

23. The processor circuit of claim 18, wherein said indicator is a stored bit.

24. The processor circuit of claim 18, wherein said priority encoder circuit further comprises an address encoder for indicating an address associated with a highest priority output of said highest priority indicator circuit.

25. The processor circuit of claim 24, wherein said address encoder further comprises a lookup table.

26. A content addressable memory (CAM) comprising:
a plurality of memory storage locations having:
associated indicators configured to indicate during a search operation of said CAM, whether each memory storage location is available for data storage in the event no match is detected by said search operation; and
a circuit operating such that if said search word does not match a word stored in any memory storage location, said search word is written automatically to a memory storage location which is indicated as available for data storage.

27. The memory of claim 26, further comprising:
a priority encoder for indicating a highest priority memory storage location of a plurality of available memory storage locations in the event no match is detected.

28. The memory of claim 27, wherein said priority encoder is also configured to indicate a highest priority match in the event a match is detected.

29. A method for operating a content addressable memory (CAM), the method comprising:
indicating at a plurality of memory storage locations, during a search operation of said CAM, whether each memory location is available for data storage in the event no match is detected by said search operation;
generating a next free address corresponding to a memory location which is indicated as available for data storage; and
storing in the memory location associated with said next free address, contents of a comparand when no match is detected by said search operation.

30. The method of claim 29, further comprising:
prioritizing available memory storage locations identified during said act of indicating.

31. The method of claim 29, further comprising:
prioritizing a plurality of matches when at least two matches are indicated during said search operation.

* * * * *